Feb. 16, 1965 F. T. THOMPSON 3,170,125
CONTROLLER CIRCUITRY
Filed Dec. 18, 1959 2 Sheets-Sheet 1

WITNESSES
Edwin E. Dassler
James F. Young

INVENTOR
Francis T. Thompson
BY Ernest P. Klipfel
ATTORNEY

Feb. 16, 1965 F. T. THOMPSON 3,170,125

CONTROLLER CIRCUITRY

Filed Dec. 18, 1959 2 Sheets-Sheet 2

United States Patent Office 3,170,125

Patented Feb. 16, 1965

3,170,125

CONTROLLER CIRCUITRY

Francis T. Thompson, Penn Hills Township, Allegheny County, Pa., assignor to Westinghouse Electric Corporation, East Pittsburgh, Pa., a corporation of Pennsylvania Filed Dec. 18, 1959, Ser. No. 860,474
13 Claims. (Cl. 332—14)

The present invention relates generally to control circuitry and more particularly to a pulse width modulator.

In order to obtain high efficiency and reliability in transistor power amplifiers, it is desirable to operate them in a switching mode. However, in most control applications, the signal to be amplified is an analog input voltage. It is necessary therefore to convert the analog input signal to a pulse width signal so that it may be amplified by switching mode power transistors. The ratio of the time when the pulse output is "on" to the time when the pulse output is "off" is dependent upon the instantaneous value of the direct current analog input signal. Should the analog signal exceed a predetermined value the pulse output will remain completely "on" or "off" depending on the polarity of the input signal. In the voltage band between the predetermined value of opposite polarities the pulse output will have a linear relationship to the analog input signal.

The present invention provides pulse width modulation by comparing the analog input signal with a symmetrical waveform generated by a separate carrier source. The frequency of the symmetrical waveform is maintained constant. By using a separate carrier source the linearity of pulse output response to the analog input signal within the bandwidth of the predetermined magnitude of opposite polarities is greatly improved.

Accordingly, an object of the present invention is to provide a pulse width modulator which is stable in operation and reliable in use.

Another object of the present invention is to provide a pulse width modulator having a high speed of response and yet having the capability of delivering considerable output power.

Another object of the present invention is to provide a pulse width modulator having a rectangular pulse output of constant frequency and constant amplitude.

Another object of the present invention is to provide a pulse width modulator having a linear output within an adjustable unsaturated range of input signals.

Another object of the present invention is to provide a pulse width modulator having a high input impedance and good null stability.

Further objects and advantages of the present invention will be readily apparent from the following detailed description taken in conjunction with the drawing, in which.

Referring to the block diagram, one or several analog input signals having any desired polarity may be applied to the summing junction or mixing input network 2. A carrier voltage source 4 which provides a waveform such as triangular, saw tooth, or sinusoidal is also introduced into the mixing network 2. The amplitude of the carrier voltage is usually set at a constant value. The transistor comparator 6 switches in a predetermined manner as controlled by the mixed or modulated signal from the mixing input network. The output of the transistor comparator 6 is amplified and shaped by the transistor switching amplifiers 8 to provide a push-pull or single ended pulse width output as desired.

Figure 2:
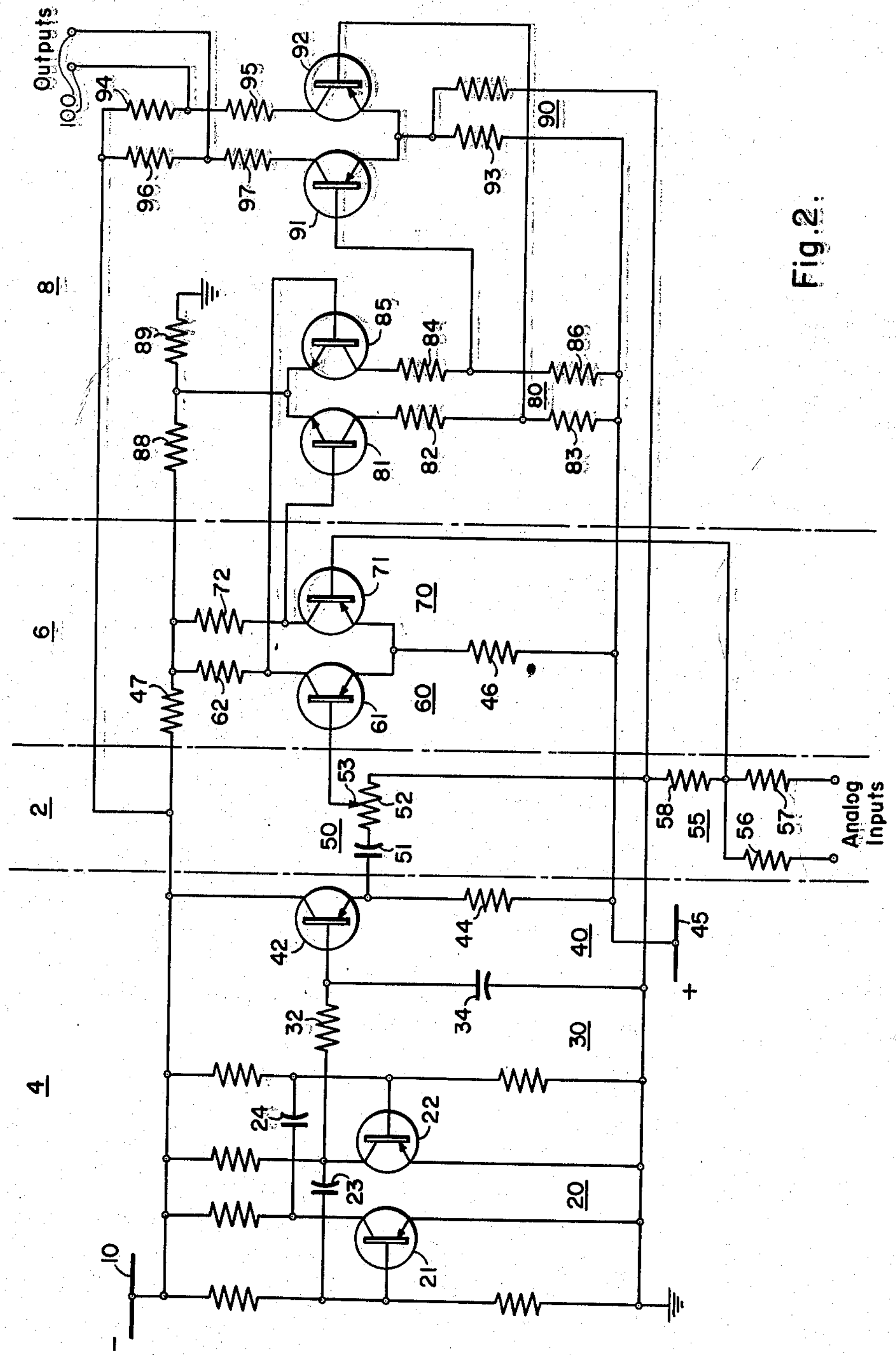
FIG. 2 is an electrical schematic diagram of the illustrative embodiment of the invention.

A specific embodiment of the pulse width modulator having a triangular carrier voltage source 4 is shown in FIG. 2.

The analog input signals are combined with the triangular waveform in the mixing input network 2 in such a manner that the sum or difference of the analog input signals modulates the triangular waveform and the resulting modulated signal is provided to the comparator 6. The mixing input circuit 2 comprises generally an RC coupling network 50 and input terminal means 55. The RC coupling network 50 comprises a serially connected capacitor 51 and variable resistor 52 with a tap connection 53 which allows the amplitude of the triangular waveform from the source 4 to be varied by means of the setting of the variable tap on the resistor 52. The RC coupling network 50 is grounded so that the average value of the triangular waveform is maintained near ground potential.

The input terminal means 55 comprises isolating resistors 56 and 57 connected to ground through a voltage dropping resistor 58.

The carrier voltage source 4 comprises generally an astable multivibrator 20, an integration circuit 30 and emitter follower circuit 40.

The astable multivibrator 20 is connected in the conventional manner to be biased by the negative bus bar 10 and comprises transistors 21 and 22 having cross coupled inputs and outputs by means of the capacitors 23 and 24. The astable circuit 20 does not have a stable state but has the equivalent of two quasi stable states forming a square wave at the collector of the transistor 22. The rate of transition from one quasi stable state to the other is determined by the circuit parameters.

The square wave at the collector of the transistor 22 is integrated by the integration circuit 30 comprising a resistive element 32 and capacitive element 34 to form a triangular wave. The emitter follower circuit 40 comprising a transistor 42 and resistor 44 serially connected between the negative bus bar 10 and ground provides a low output impedance for the triangular voltage wave.

The carrier voltage source 4 maintains its frequency within close tolerances over a wide temperature range. Ceramic positive temperature coefficient capacitors may be used for the capacitive elements 23 and 24 to reduce the frequency variation of the carrier voltage source 4. It can be seen that any frequency variation of the carrier source 4 may change the gain of the pulse width modulator proportionately by changing the triangular waveform amplitude. This undesirable variation may be substantially eliminated by using a correct temperature coefficient of resistance for the resistive element 32 in the integrating circuit 30. The emitter follower circuit 40 provides a low output impedance for the triangular voltage thereby improving the flexibility of the circuit.

Reducing the amplitude of the triangular waveform by means of the tap connection 53 will result in an increase in the gain or sensitivity of the pulse width modulator. Typical triangular waveforms may also be adjusted by means of the resistive element 32 in the integrating circuit 30.

The comparator 6 comprises a first amplifier circuit 60 and a second amplifier circuit 70 including transistor elements 61 and 71 respectively. The amplifier circuits 60 and 70 include a common emitter circuit connected to the positive potential bus bar 45 through the resistor 46. The collector of each transistor is negatively biased through resistors 62 and 72 respectively and a voltage divider consisting of resistors 47, 88, and 89. Output means is connected to the collector of each transistor and is provided with two output states one of which will occur at the output means dependent upon which amplifier circuit is energized.

The analog input signals to the input terminal means 55 are combined with the triangular waveform passing through the RC coupling network 50 in the mixing input network 2 in such a manner that the sum or difference of the analog input signals and the triangular waveform appears serially in effect between the base electrodes of the transistors 61 and 71. The average value of these base voltages is maintained near ground potential. An essentially constant current flows through the resistor 46. This current divides between transistors 61 and 71, the majority of current flowing in the transistor with the more negative base. Normally, one transistor or the other carries all the current. The current is shared only during the times of transition from one transistor to the other. The constant frequency triangular waveform which effectively appears between the bases causes the transitions to occur at a given average fixed rate. The net input signal resulting from the analog input signals in turn determines the portion of the time that each transistor conducts. The peak-to-peak net input signal resulting from the analog input signals to the input terminal means 55, in order to fully modulate the pulse width outputs, must be equal to the peak-to-peak amplitude of the triangular waveform appearing on the base electrode of the transistor 61 and the transistor 71. The comparator 6 functions as a high gain saturating differential amplifier having a pulse output of frequency equal to the frequency of the carrier voltage source 4 and having an "on" to "off" time directly related to the polarity and magnitude of the summation of the analog input signals to the input terminal means 55. Upon the summation analog input signal exceeding a magnitude greater than the bandwidth magnitude the differential amplifier will be saturated such that a constant positive or constant negative signal appears at the output means depending upon the polarity of the actuating saturating signal.

The collector voltage transitions of the transistors 61 and 71 are determined by the current transitions. The transition time is shortened by the switching amplifiers 8. The switching amplifiers 8 are illustrated as comprising a first section of amplifiers 80 and a second section of amplifiers 90.

The first section 80 comprises transistors 81 and 85 of opposite conductivity type from the transistors 61 and 71. A common emitter circuit is negatively biased to the negative potential bus 10 through a resistor 88 and the common emitter circuit is also grounded through the resistor 89. Each emitter is positively biased to the positive bus bar 45 through serially connected resistors 82 and 83 for the transistor 81, and resistors 84 and 86 for the transistor 85.

The output means of the comparator 6 in connected across the base electrodes of the transistors 81 and 85. When transistor 71 conducts, transistor 81, to which it is connected, also conducts. The emitter-base circuit of the transistor 81 clamps the collector of the transistor 71 to the negative potential determined by the voltage applied to the emitter of transistors 81 and 85 by the voltage divider consisting of resistors 47, 88 and 89. This maintains the collector of transistor 71 at a potential which is negative with respect to its base, i.e., a reverse bias is maintained across the collector-base junction. High current gain operation is maintained resulting in a desirable high input impedance. The same action occurs between the transistors 61 and 85. This is accomplished by choosing the polarity of transistors 81 and 85 opposite to that of transistors 61 and 71 and by connecting the emitters of transistors 81 and 85 to an appropriate biasing potential.

The transition of collector voltage of transistors 61 and 71 is determined by the current transitions. The transition time is shortened by switching transistors 81 and 85 which allow the obtaining of a rectangular shaped pulse output waveform. The power level of the pulse width modulator is increased by transistor switching amplifiers in the second section 90. The second section 90 comprises a transistor 91 and transistor 92 having a common emitter circuit connected to the positive potential bus bar 45 through the resistor 93. The collectors are negatively biased by the negative bus bar 10 through series resistors 94, 95 and 96, 97 connected in a similar manner as the collectors in the first section 80. It will be noted however, that the transistors of the second section are of opposite polarity and therefore are connected to opposite polarity bus bars from the first section 80. The base electrodes of the transistors 91 and 92 are connected to the output means of the first section 80. The resistor coupling between the transistors 85 and 91 and between transistors 81 and 92 provides efficient driving and blocking of the switching transistors 91 and 92. When transistor 85 is cut off the resistor 86 returns the base electrode of the transistor 91 to a positive potential, which quickly clears carriers from the base region of the transistor 91 and thereby provides rapid switching. Transistor 91 is held cut off even after high temperatures, by the resistor 86, resulting in high reliability. When transistor 85 conducts it draws most of its current from the base of the transistor 91, providing efficient drive. The remainder of the current which is drawn through the resistor 86 is nearly equal to the maximum blocking current that can be provided by resistor 86 for transistor 91 when transistor 91 is cut off. It is to be understood that the maximum blocking current is equal to the maximum leakage current at transistor 91 may draw during its cut off condition without allowing the base of the transistor 91 to become negative, thereby allowing large collector currents to flow. When the transistor 91 is made conducting by transistor 85 through resistor 84, the base voltage of transistor 91 is only a fraction of a volt more negative than when drawing the maximum blocking current. The current through resistor 86, which subtracts from the driving current from transistor 85, is therefore nearly fully utilized for blocking transistor 91 when transistor 85 is cut off.

The outputs from the transistors 91 and 92 are applied to the output terminals 100 through a similar network as just described. In this case, when similar polarity transistors are used, resistive element 94 supplies the driving current when transistor 92 is cut off and resistive element 95 the blocking current when transistor 92 is conducting.

Thus, it is readily apparent that the present invention provides a pulse width modulator which is linear, stable, reliable, has a low power level and, low time delay allowing the amplification of an analog direct current signal to a pulse width modulated output signal. The characteristics of the pulse width modulator are easily predictable and units may be easily duplicated.

A balanced or push-pull comparator has been used to achieve good null stability, i.e., freedom from D.-C. drift. In transistor circuits the base-collector leakage current $I_{co}$, which increases exponentially with temperature is a troublesome phenomenon. This leakage current when flowing through the base return resistors, 52 and 53, causes a change in the potential of the transistor bases. Null drift occurs if the change in the base voltage of one of the comparator transistors does not equal the change of the base voltage of the other transistor. Null drift may be minimized by using equal value base resistors which have a low resistance. Unfortunately, low resistance base resistors result in a low value of input impedance and require relatively large amounts of power from the analog input source.

Figure 3:
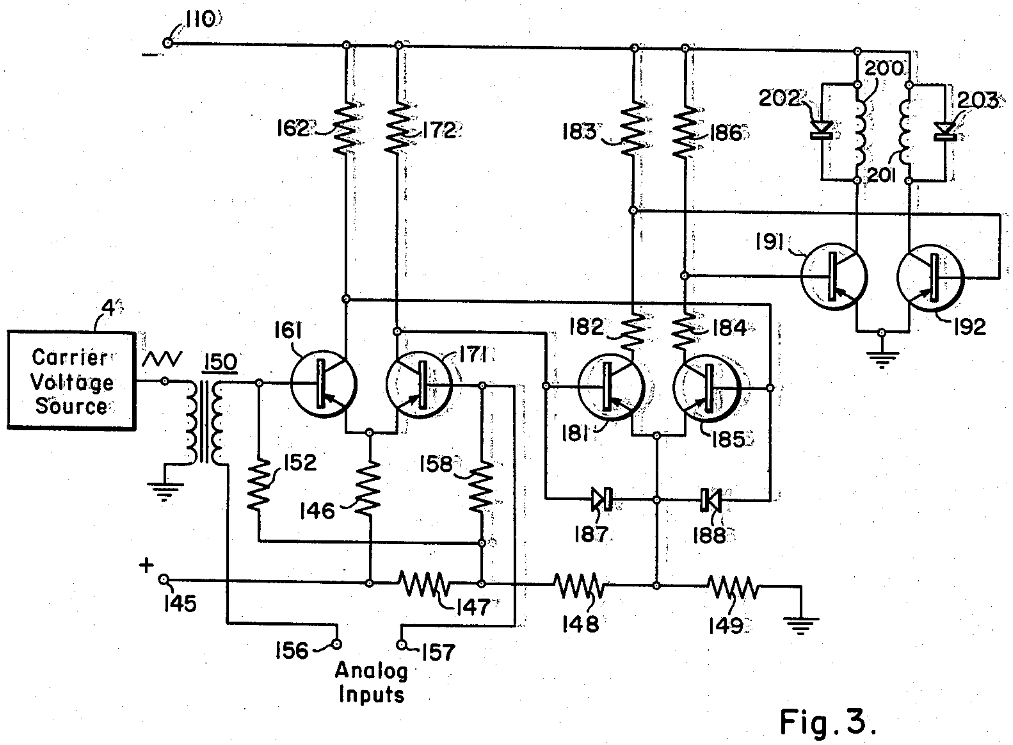
FIG. 3 is an electrical schematic diagram of a second illustrative embodiment of the invention.
Figure 1:
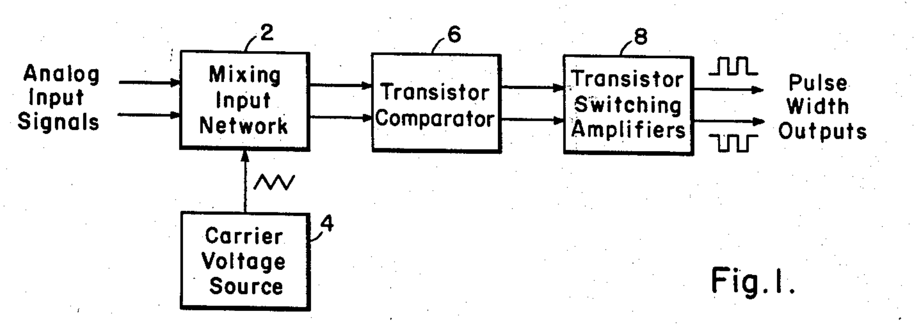
FIGURE 1 is a block diagram of an illustrative embodiment of the invention.

In cases where low available input power requires a high input impedance and very good null stability is required, the comparator of FIGURE 3 provides a solution. The triangular waveform derived from the carrier voltage source 4 is introduced across the primary of a transformer 150. The secondary of transformer 150 provides a triangular waveform which is isolated from the D.-C. supply voltages. The analog input voltage applied to terminals 156 and 157 are isolated from the D.-C. supply voltages shown as the negative bus bar 110 and positive bus bar 145. The average potential of the bases of transistors 161 and 171 relative to the supply voltages is determined by resistors 152 and 158. These resistors preferably have equal resistances, their value being chosen as low as possible without excessively loading the analog input. The input impedance of the comparator circuit in many embodiments has been primarily determined by the sum of resistance values 152 and 158 since very little current is drawn by transistors 161 and 171. The excellent null stability of this circuit results from taking advantage of the normally low resistance of the analog signal source. The null drift resulting from transistor leakage current is equal to the difference in leakage currents of transistors 161 and 171 multiplied by the equivalent resistance appearing between the bases of these transistors. This equivalent resistance is equal to the parallel combination of the resistance of the two external parallel paths between the transistor bases. The resistance of the first path is equal to the sum of resistances 152 and 158 while the resistance of the second path is equal to the sum of the secondary resistance of transformer 150 and the resistance of the analog input source. Placing this second path in parallel with the first path accounts for the excellent null stability. Resistors 152 and 158 can be chosen to have a relatively high value of resistance since the circuit is insensitive to changing both base voltages by an equal amount.

The operation of the comparator is identical with that of FIG. 2. The analog input and triangular waveform are added and appear between the bases of transistors 161 and 171. The majority of current flowing through resistor 146 flows through the transistor having the more negative base.

If the base resistors 152 and 158 are connected to ground the transistor switching amplifiers 8 can be identical with those of FIG. 2. However, an alternate embodiment of the transistor switching amplifiers 8 is shown in FIG. 3 and illustrates the use of transistors having the same polarity. During the time that transistor 161 is conducting, transistor 185 is non-conducting and transitor 191 is conducting. During this same time transistor 171 is non-conducting, transistor 181 is conducting and transistor 192 is non-conducting.

Since transistors 161 and 181 are of the same conductivity type, the high input impedance feature of the circuit of FIG. 2 is not obtained. This feature is retained by connecting a diode 188 to the collector of transistor 161. When transistor 161 is conducting, diode 188 conducts and clamps the collector of transistor 161 to a negative voltage with respect to its base. A diode 187 operates in the same manner with transistor 171. Proper biasing of these transistors is provided by voltage dividing resistors 147, 148 and 149 which preferably have a considerably lower resistance than the other resistors in the circuit.

Transistor 185 drives transistor 191 through coupling resistors 184 and 186. When transistor 185 is non-conducting, the current through resistor 186 flows into the base of transistor 191 and causes it to conduct. This value of current will be referred to as the base driving current. When transistor 185 conducts the current through resistor 184 is sufficiently larger than the base driving current plus the maximum anticipated leakage current to insure that transistor 191 is blocked. Resistor 184 is desirable if transistor 191 is a high current transistor to limit the magnitude of the initial blocking current required to remove current carriers from the base. This resistor is not necessary for operation of the circuit, however. Transistor 181 is coupled in a similar manner to transistor 192 by resistors 182 and 183.

The loads in the collector circuit of transistors 191 and 192 may be resistive. The transistor switching amplifiers may be used to drive electromechanical loads in which case the loads may be inductive such as shown at 200 and 201. The pulse width amplifier is well suited to driving this type load if commutating diodes 202 and 203 are added to provide a path for inductor current when the transistor is cut off. The D.-C. component of current through the inductance is proportional to the pulse width.

While a particular embodiment of the present invention has been described for the purposes of illustration, it is to be understood that all equivalents, modifications, and alterations within the spirit and scope of the invention are herein meant to be included. It is to be noted that while PNP transistors have been shown in the comparator circuit 6, NPN transistors may be used in the comparator and the following stages with proper changes in polarity. Of course, the number of amplifier stages may also be altered depending upon the input signal level and the desired power output level.

I claim as my invention:

1. A pulse width modulator apparatus comprising, in combination, comparator means having two output states and including input means and output means; means for providing a first input signal of constant frequency symmetrical waveform to said input means, means for providing an analog input signal to said input means; said input means modulating said first input signal with said analog input signal and providing the resulting modulated signal to said comparator means; said comparator means comprising a first amplifier circuit and a second amplifier circuit each including a transistor element having an emitter electrode, a collector electrode and a base electrode, a common emitter circuit included in said comparator means and connected to a potential source of predetermined polarity; said modulated signal applied between said base electrodes by said input means, said output means connected to each collector electrode and adapted to provide an output signal responsive to the conduction of said transistor elements, a second transistor for each said amplifier circuit but of opposite conductivity type from the transistor elements used in said first and second amplifier circuits, each said second transistor having an emitter electrode, a collector electrode and a base electrode; the emitter electrode of each said second transistor returned to a potential source of opposite polarity to said potential source connected to said common emitter circuit; circuit means connected between the collector of each of said first transistors and the base electrode of its respective second transistor for rendering said second transistor conductive when said associated first transistor is conductive, the emitter-base circuit of said second transistor clamping the collector electrode of said first transistor to said predetermined polarity potential.

2. A pulse width modulator apparatus comprising, in combination, comparator means having two output states and including input means and output means; means for providing a first input signal of constant frequency symmetrical waveform to said input means, means for providing a second input signal to said input means; said input means modulating said first input signal with said second input signal and providing the resulting modulated signal to said comparator means; said comparator means comprising a first amplifier circuit and a second amplifier circuit each including a first transistor element having an emitter electrode, a collector electrode and a base electrode, a common emitter circuit included in said comparator means, said modulated signal applied between said base electrodes by said input means, said output means connected to each collector electrode and adapted to provide an output signal responsive to the conduction of said first transistor elements; a second transistor of opposite conductivity type from said first transistor for each said first transistor; each second transistor having a base electrode, a collector electrode, and an emitter electrode; the emitter of each said second transistor returned to a potential source of opposite polarity to the potential source connected to said common emitter circuit; circuit means connected between the collector of each said first transistor and the base electrode of its respective second transistor for rendering said second transistor conductive when said associated first transistor is conductive; the emitter-base circuit of said second transistor clamping the collector electrode of said first transistor to a predetermined polarity potential.

3. A pulse width modulator apparatus having low direct current drift comprising, in combination, comparator means having two output states and including input means and output means; a direct current bias supply; means for providing a first input signal to said input means of constant frequency symmetrical waveform isolated from direct current supply potentials; means for providing an analog input signal to said input means isolated from direct current supply potentials; said comparator means comprising a first amplifier circuit and a second amplifier circuit each including a transistor element having an emitter electrode, a collector electrode and a base electrode; a common emitter circuit included in said comparator means; said input means having parallel paths between the bases of said transistors; one of said paths including a base resistor for each transistor connecting said base electrodes together; the other of said paths including the impedance of said means for providing an analog input signal.

4. A pulse width modulator apparatus having low direct current drift comprising, in combination, comparator means having two output states and including input means and output means; a carrier voltage source providing a first input signal of constant frequency symmetrical waveform to said input means; transformer means, including a primary winding and a secondary winding, interconnecting said carrier voltage source and said input means for isolating the first input signal from direct current supply potentials; means for providing an analog input signal to said input means isolated from direct current supply potentials; said comparator means comprising a first amplifier circuit and a second amplifier circuit each including a transistor element having an emitter electrode, a collector electrode and a base electrode; a common emitter circuit included in said comparator means; said input means having parallel paths between the bases of said transistors; one of said paths including a base resistor for each transistor connecting said base electrodes together; the other of said paths including the impedance of said means for providing an analog input signal and the impedance of said secondary winding.

5. In a differential amplifier wherein each of first and second amplifier channels includes a transistor having respective emitter, base, and collector electrodes, a circuit commonly connected to said emitter electrodes for supplying substantially constant current to said emitter electrodes in parallel, and clamp means for maintaining a reverse bias across the collector-base junction of each of said transistors.

6. Pulse width modulator apparatus comprising comparator means having input means and output means, said comparator means having amplifying means including first and second amplifiers each having a control electrode, a constant current path having a common point to which said amplifiers are connected, said input means including said control electrodes, means for providing to said input means a periodic signal with a waveform for rendering said amplifiers alternately conductive, said waveform having an average value at a reference level, means for providing a second input signal to said input means, said input means employing said first and second input signals to cooperatively drive said amplifying means, whereby the respective conduction times of said amplifiers are rendered unequal in response to said second signal deviating from said reference level.

7. Pulse width modulator apparatus comprising comparator means having amplifying means including first and second semiconductor amplifiers each having a control electrode, a path carrying constant current and having a common point connected to both said amplifiers, means for supplying to one of said control electrodes a periodic signal having a waveform for rendering said amplifiers alternately conductive, said waveform having an average value at a reference potential, and means for supplying a second signal to the other of said control electrodes, whereby the conduction times of said amplifiers are rendered unequal in response to deviation of said second signal from said reference potential.

8. Pulse width modulator apparatus comprising comparator means having input means, output means and amplifying means, said amplifying means including first and second amplifiers each including a transistor element having respective emitter, collector and base electrodes, a circuit commonly connected to said emitter electrodes for supplying substantially constant current to said emitter electrodes in parallel, said input means including said base electrodes, means providing to said input means a periodic signal with a waveform that renders said transistor elements alternately conductive, and waveform having an average value at a reference potential, means for providing a second input signal to said input means, said input means employing said input signals to form a composite drive to said amplifying means whereby the respective conduction times of said transistor elements are rendered unequal in response to said second signal deviating from said reference potential.

9. Pulse width modulator apparatus comprising comparator means having amplifying means including first and second amplifiers each including a transistor element having respective emitter, base and collector electrodes, a circuit commonly connected to said emitter electrodes for supplying substantially constant current to said emitter electrodes in parallel, means for supplying to the base electrode of one of said transistor elements a first periodic signal with a waveform for rendering said transistor elements alternately conductive, said waveform having an average value at a reference potential, means for supplying a second signal to the base electrode of the other transistor element, whereby the respective conduction times of said transistor elements are rendered unequal in response to deviation of said second signal from said reference potential.

10. Pulse modulator apparatus comprising comparator means having input means, output means and amplifying means, said amplifying means including first and second amplifiers each including a transistor element having respective emitter, collector and base electrodes, a circuit commonly connected to said emitter electrodes for supplying substantially constant current to said emitter electrodes in parallel, said input means including said base electrodes, means providing to said input means a periodic signal with a waveform that renders said transistor elements alternately conductive, said waveform having an average value at a reference potential, means for providing a second input signal to said input means, said input means employing said input signals to form a composite drive to said amplifying means whereby the respective conduction times of said transistor elements are rendered unequal in response to said second signal deviating from said reference potential, and means for maintaining a reverse bias across the collector-base junction of each of said transistors.

11. Pulse width modulator apparatus comprising comparator means having amplifying means including first and second amplifiers each including a transistor element having respective emitter, base and collector electrodes, a circuit commonly connected to said emitter electrodes for supplying substantially constant current to said emitter electrodes in parallel, means for supplying to the base electrode of one of said transistor elements a first periodic signal with a waveform for rendering said transistor elements alternately conductive, said waveform having an average value at a reference potential, means for supplying a second signal to the base electrode of the other transistor element, whereby the respective conduction times of said transistor elements are rendered unequal in response to deviation of said second signal from said reference potential, and clamp means for maintaining a reverse bias across the collector-base junction of each of said transistor elements.

12. Pulse width modulator apparatus comprising a differential amplifier having first and second amplifiers, a substantially constant current circuit commonly connected to said first and second amplifiers, means for supplying first and second input signals directly to said differential amplifier, the first of said signals having a periodic waveform for rendering said first and second amplifiers alternately conductive into saturation, whereby the differential amplifier produces pulses whose width is modulated in accordance with variations of said second input signal.

13. Pulse width modulator apparatus comprising a differential amplifier having first and second transistors, each having respective base, emitter and collector electrodes, a substantially constant current circuit commonly connected to said emitter electrodes, means for supplying first and second input signals directly to said differential amplifier, the first of said signals having a periodic waveform for alternately rendering said first and second transistors conductive into saturation, whereby said differential amplifier produces pulses whose width is modulated in accordance with the amplitude and polarity of said second signal, and means for maintaining a reverse bias across the collector-base junction of each said transistors.

References Cited in the file of this patent

UNITED STATES PATENTS

| | | |
|---|---|---|
| 2,748,272 | Schrock | May 29, 1956 |
| 2,867,763 | Sichling | Jan. 6, 1959 |
| 2,891,726 | Decker et al. | June 23, 1959 |
| 2,951,212 | Schmid | Aug. 30, 1960 |
| 2,990,516 | Johannessen | June 27, 1961 |
| 3,010,078 | Stefanov | Nov. 21, 1961 |
| 3,074,020 | Ropiequet | Jan. 15, 1963 |